US006771110B2

United States Patent
Golliher et al.

(10) Patent No.: US 6,771,110 B2
(45) Date of Patent: Aug. 3, 2004

(54) INVERTING LEVEL SHIFTER WITH START-UP CIRCUIT

(75) Inventors: Sean A. Golliher, Windsor, CO (US); Scott C. Savage, Fort Collins, CO (US); John L. Mcnitt, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/374,139

(22) Filed: Feb. 25, 2003

(65) Prior Publication Data

US 2003/0128058 A1 Jul. 10, 2003

Related U.S. Application Data

(62) Division of application No. 09/884,327, filed on Jun. 19, 2001, now Pat. No. 6,559,704.

(51) Int. Cl.[7] .......................................... H03K 19/0185
(52) U.S. Cl. ............................ 327/333; 326/68; 326/81
(58) Field of Search ............................... 326/68, 70, 71, 326/81; 327/333

(56) References Cited

U.S. PATENT DOCUMENTS

| 4,419,593 | A | | 12/1983 | Butler et al. ............... 327/108 |
|---|---|---|---|---|
| 4,672,243 | A | * | 6/1987 | Kirsch ........................ 326/71 |
| 5,136,191 | A | * | 8/1992 | Nunogami ................... 326/81 |
| 5,204,557 | A | * | 4/1993 | Nguyen ...................... 326/81 |
| 5,493,245 | A | | 2/1996 | Kao et al. ................... 327/333 |
| 5,541,546 | A | * | 7/1996 | Okumura .................... 327/333 |
| 6,049,228 | A | * | 4/2000 | Moon ......................... 326/81 |
| 6,181,165 | B1 | | 1/2001 | Hanson et al. .............. 326/81 |
| 6,310,492 | B1 | | 10/2001 | Ikoma et al. ................ 326/81 |
| 6,346,829 | B1 | | 2/2002 | Coddington ................. 326/81 |
| 6,400,206 | B2 | * | 6/2002 | Kim et al. ................... 327/333 |
| 6,686,899 | B2 | * | 2/2004 | Miyazawa et al. .......... 345/100 |
| 2002/0047740 | A1 | * | 4/2002 | Suzuki et al. ............... 327/333 |

OTHER PUBLICATIONS

"Other Inverter Configurations", Part II CMOS Digital Circuits, Chapter 11.5, p. 224.
"The Bootstrapped NMOS Inverter", Part II CMOS Digital Circuits, Chapter 11.5.3, pp. 226–227.

* cited by examiner

Primary Examiner—Timothy P. Callahan
Assistant Examiner—Terry L. Englund
(74) Attorney, Agent, or Firm—Christopher P. Maiorana, P.C.

(57) ABSTRACT

An apparatus comprising a method for providing inverting level shifting, comprising the steps of (A) receiving an input signal having a first predetermined voltage level, (B) controlling a voltage level of said input signal and (C) generating an output signal having a second predetermined voltage level, wherein step (C) provides full scale output voltages between a first supply and a second supply.

19 Claims, 4 Drawing Sheets

US 6,771,110 B2

INVERTING LEVEL SHIFTER WITH START-UP CIRCUIT

This is a divisional of U.S. Ser. No. 09/884,327 filed Jun. 19, 2001, now U.S. Pat. No. 6,559,704 B1, issued May 6, 2003.

FIELD OF THE INVENTION

The present invention relates to a method and/or architecture for implementing level shifters generally and, more particularly, to a method and/or architecture for implementing inverting level shifters with start-up circuits.

BACKGROUND OF THE INVENTION

With ever increasing digital clock speeds, faster digital translation circuits are required for multi-voltage designs. Conventional digital translation circuits that level shift digital signals up to higher voltages are generally too slow for high speed operation (i.e., 650 MHz or higher). Slower conventional level shifting circuits (such as 4 transistors with cross coupled PMOS devices) are used in digital, analog, and mixed signal multi-voltage designs. Such conventional level shifting circuits often fail since they do not provide full output swing at high speeds and extreme process corners.

It would be desirable to provide a high speed (e.g., 650 MHz or higher) level shifting function for digital signals to translate lower voltage signals (e.g., 0 to 1.5 v) to higher voltages (e.g., 0 to 3.3 v) while adding a minimal amount of jitter (e.g., less than 2 ps).

SUMMARY OF THE INVENTION

The present invention concerns an apparatus comprising a control circuit and a logic circuit. The control circuit may be configured to receive an input signal and an indication signal and present a complement of the input signal. The logic circuit may be configured to receive the complementary input signal and generate an output signal. The output signal may provide a larger full scale output swing than the input signal since the output signal may be on a voltage supply with a higher voltage.

The objects, features and advantages of the present invention include the implementation of an inverting level shifter with a start-up circuit that may (i) be capable of high speed level shifting (e.g., clock speeds greater than 650 Mhz) from lower supply voltages to higher supply voltages, (ii) provide full scale output voltages (e.g., swings from VSS to VDD2), (iii) allow output clocks to charge down to zero volts, (iv) provide output voltage levels from VSS to VDD2, (v) provide low power consumption, (vi) eliminate static power dissipation, (vii) operate from two power supplies (e.g., 1.5V and 3.3V), (viii) implement a startup circuit that may provide correct start up operation, (ix) implement a capacitor as a bootstrap device, and/or (x) allow a capacitor to be charged on a transition of an input.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
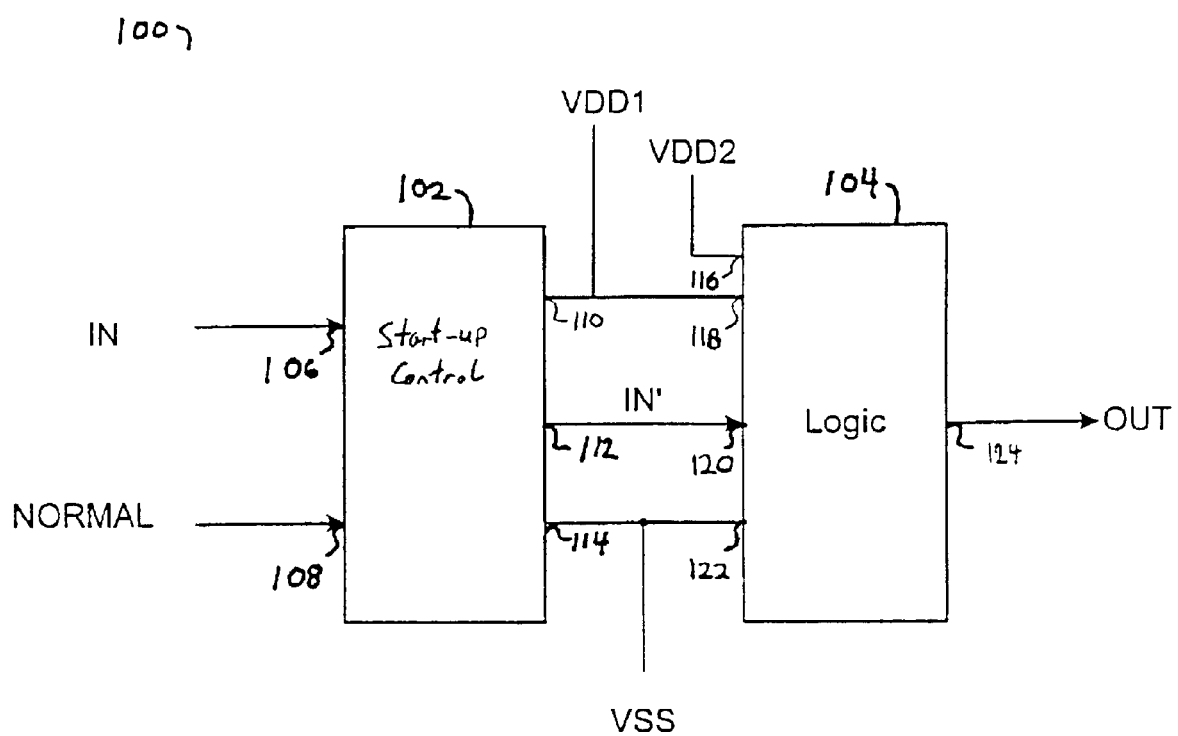
FIG. 1 is a block diagram of a preferred embodiment of the present invention.

Referring to FIG. 1, a block diagram of a circuit 100 is shown in accordance with a preferred embodiment of the present invention. The circuit 100 may be implemented as a level shifter. The circuit 100 may be capable of high speed level shifting at high clock speeds (e.g., clock speeds greater than 650 Mhz). The circuit 100 may also provide full scale output voltages (e.g., swing from VSS to VDD2), output voltages down to zero volts, low power consumption and eliminate static power dissipation.

The circuit 100 generally comprises a block (or circuit) 102 and a block (or circuit) 104. The circuit 102 may be implemented as a startup control circuit. The circuit 104 may be implemented as a logic circuit. The circuit 102 may have an input 106 that may receive a signal (e.g., IN), an input 108 that may receive a signal (e.g., NORMAL), an input 110 that may receive a first supply voltage (e.g., VDD1), an output 112 that may present a signal (e.g., IN') and an input 114 that may receive a ground voltage (e.g., VSS).

The circuit 104 may have an input 116 that may receive a second supply voltage (e.g., VDD2), an input 118 that may receive the first supply voltage VDD1, an input 120 that may receive the signal IN', an input 122 that may receive the voltage VSS and an output 124 that may present an output signal (e.g., OUT). In one example, the signal OUT may be configured to drive an external device (not shown). The signal IN may be implemented, in one example, as a 1.5V input signal. However, other voltages (e.g., from 1.0 to 5.5V) may be implemented accordingly to meet the design criteria of a particular implementation. The signal IN' may be implemented as a complement of the signal IN. The signal OUT may be implemented as a 3.3V output signal. The supply voltage VDD1 may be implemented as a first supply (e.g., 1.5V) and the supply voltage VDD2 may be implemented as a second supply (e.g., 3.3V). However, other voltages may be implemented accordingly to meet the design criteria of a particular implementation. The ground voltage VSS may be implemented as a virtual ground voltage or other ground voltage.

Figure 2:
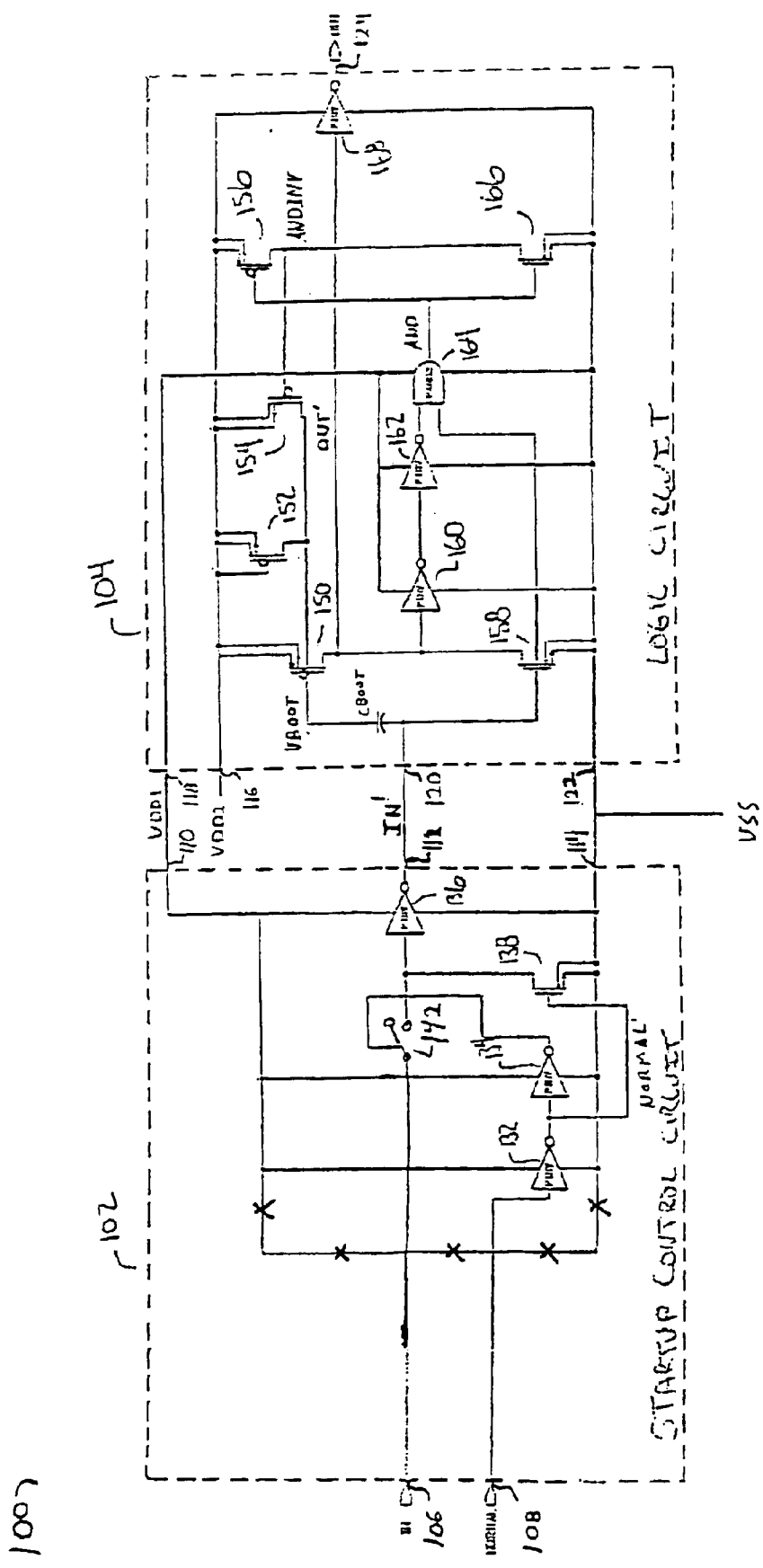
FIG. 2 is a schematic of the circuit of FIG. 1.

Referring to FIG. 2, a more detailed diagram of the circuit 100 is shown. The circuit 102 is shown comprising a circuit 132, a circuit 134, a circuit 136 and a circuit 138. The circuit 102 may also comprise a switch 142. The circuits 134 and 136 may be implemented as inverters. The circuit 138 may be implemented as a transistor. In particular, the transistor 138 may be implemented as a N-channel transistor. The inverter 136 may be implemented in the signal path to generally guarantee an edge fast enough on the signal IN' to charge up a bootstrap device.

Each of the inverters 132, 134, and 136 may be coupled to VDD1 and VSS. The signal IN may be presented to a pole of the switch 142. The signal NORMAL may be presented to the inverter 132 as an indication signal. The inverter 132 may present a signal (e.g., NORMAL') to the inverter 134. An output of the inverter 134 may be presented to the switch 142 to control the pole. The switch 142 may also be coupled to the inverter 136 and to a source of the transistor 138. The switch 142 may be configured to disconnect the signal IN from an input of the inverter 136 when the indication signal NORMAL is LOW. The switch 142 may be configured to pass the signal IN when the indication signal NORMAL is HIGH. A gate of the transistor 138 may receive the signal NORMAL'. A source and a bulk of the transistor 138 may be coupled to the ground VSS. An output of the inverter 136 may present the complementary signal IN'. The transistor 138 may be configured to pull an input of the inverter 136 low when the signal NORMAL is LOW. The transistor 138 may cause the complementary signal IN' to be at the potential VDD1 through the inverter 136.

The circuit 104 generally comprises a capacitor (e.g., CBOOT), a circuit 150, a circuit 152, a circuit 154, a circuit 156, a circuit 158, a circuit 160, a circuit 162, a circuit 164, a circuit 166 and a circuit 168. The circuits 150, 152, 154, 156, 158 and 166 may be implemented as transistors. The circuits 160, 162 and 168 may be implemented as inverters. In one example, the transistors 150, 152, 154 and 156 may be implemented as P-channel transistors and the transistors 158 and 166 may be implemented as N-channel transistors. However, other transistor types and/or polarities may be implemented accordingly to meet the design criteria of a particular implementation.

A first side of the capacitor CBOOT may be configured to receive the signal IN'. A second side of the capacitor CBOOT may be coupled to a node (e.g., VBOOT). The capacitor CBOOT may comprise a bootstrapping device. The capacitor CBOOT may also be constantly recharged on every low (e.g., "0V") to high (e.g., "1.5V") transition on the input IN'. The capacitor CBOOT may be configured to charge when the node IN' is held at VDD1 by the transistor 138 through the inverter 136.

A source and bulk of the transistor 150 may be coupled to the supply VDD2. A gate of the transistor 150 may be coupled to the node VBOOT. A drain of the transistor 150 may be coupled to a node (e.g., OUT'). The node OUT' may also be coupled to a drain of the transistor 158, an input of the inverter 160 and an input of the inverter 168. A source, gate and bulk of the transistor 152 may be coupled to the supply VDD2. A drain of the transistor 152 may be coupled to the node VBOOT. A source and bulk of the transistor 154 may be coupled to the supply VDD2. A gate of the transistor 154 may be coupled to a node (e.g., ANDINV). A drain of the transistor 154 may be coupled to the node VBOOT. A source and bulk of the transistor 156 may be coupled to the supply VDD2. A gate of the transistor 156 may be coupled to a node (e.g., AND). A drain of the transistor 156 may be coupled to the node ANDINV. A drain of the transistor 166 may be coupled to the node ANDINV. A gate of the transistor 166 may be coupled to the node AND. A source and bulk of the transistor 166 may be coupled to the ground potential VSS. A drain of the transistor 158 may be coupled to the node OUT'. A gate of the transistor 158 may receive the signal IN'. A source and a bulk of the transistor 158 may be coupled to the ground potential VSS. A gate of the transistor 158 may be connected to an input of the AND gate 164.

The inverter 160, the inverter 162 and the gate 164 may be coupled to the power supply VDD1 and the ground potential VSS. Therefore, the circuit 104 may operate off of the supply VDD1 and the supply VDD2. The inverter 160 may have an input coupled to the node OUT'. An output of the inverter 160 may be presented to the inverter 162. An output of the inverter 162 may be presented to an input of the gate 164. The gate 164 may present a signal on the node AND. The gate 164, the device 156 and the device 166 may be implemented to provide a NAND function. The inverter 168 may receive a signal on the node OUT' and present the signal OUT. The inverter 168 may be sized to drive the signal OUT for a next logic stage.

The startup control circuit 102 may be configured to stop the input signal IN from being presented to the circuit 104 and allow the capacitor CBOOT to charge. For example, during a reset, the capacitor CBOOT may charge, since the signal IN' is at VDD1. When the signal NORMAL is high, the signal IN may be presented to the circuit 104 through the inverter 136. When the signal NORMAL is low, the input of the inverter 136 is held low and the output signal IN' is high allowing the capacitor CBOOT to charge.

Figure 3:
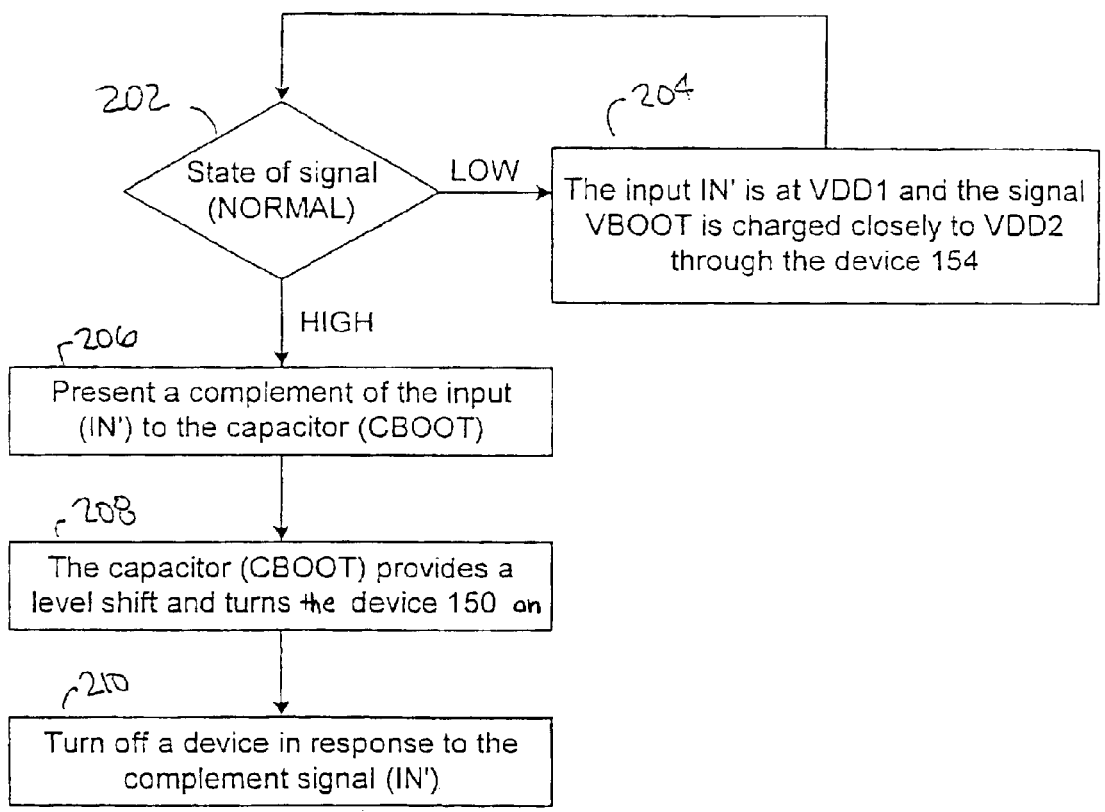
FIG. 3 is a flow chart illustrating an operation of the present invention.

Referring to FIG. 3, an operation (or method) 200 of the present invention is shown. The operation 200 generally comprises a decision state 202, a state 204, a state 206, a state 208 and a state 210. At the state 202, a state of the signal NORMAL may be determined. If the signal NORMAL is LOW, the method 200 may continue to the state 204. At the state 204, the capacitor CBOOT may be configured to charge. The state 204 may then continue to the state 202. If the signal NORMAL is HIGH, the method 200 may continue to the state 206. At the state 206, the inverted signal IN' may be presented to a bottom plate of the capacitor CBOOT. At the state 208, the capacitor CBOOT may provide a level shift to the PMOS device 150 that may cause the input signal IN' to have a voltage swing of 3.3V down to 3.3V–1.5V, where 1.5V is a maximum voltage of the signal IN' to turn the device 150 on. At the state 210, the PMOS device 150 may be completely turned off when the signal IN' is at 1.5V.

Figure 4:
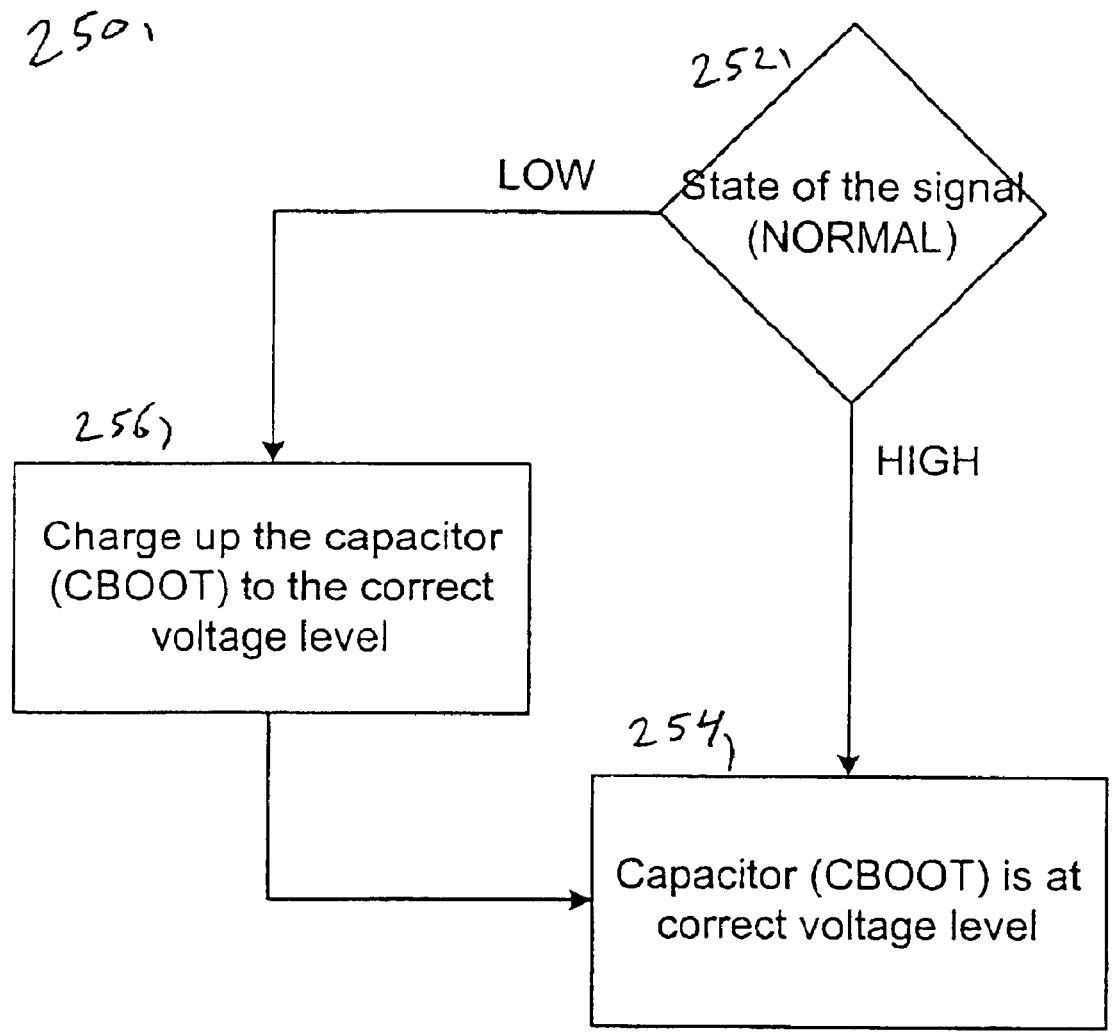
FIG. 4 is a flow chart illustrating an operation of the present invention.

Referring to FIG. 4, a process (or method) 250 of the present invention is shown. The method 250 generally comprises a decision state 252, a state 254 and a state 256. The method 250 may provide a correct start up operation that operates off of two power supplies (e.g., VDD1 and VDD2). Since the capacitor CBOOT may start up with an unknown potential, the gate 164 may be implemented in conjunction with the device 156, the device 166 and the device 154 to correctly charge a top plate of the capacitor CBOOT. The state 252 may determine if the start up state is correct as indicated by a state of the signal NORMAL. If the signal NORMAL is HIGH, the method 250 may continue to the state 254. At the state 254, the capacitor CBOOT may be at a correct voltage level. If the signal NORMAL is LOW, the method 250 may continue to the state 256. At a state 256, if the node VBOOT is not at 3.3V when the signal IN' is at 1.5V, the circuit 100 may not be in the correct start up state. Therefore, the gate 164 may sense 1.5V on the input 120 and a particular voltage on another input and generate 1.5V on the node AND. The signal on the node AND may then be inverted and presented on the node ANDINV. The node ANDINV may then sit at 0V causing the device 154 to charge the capacitor CBOOT to a correct voltage level.

The circuit 100 may be capable of high speed level shifting at clocks greater than 650 Mhz. The circuit 100 may operate from two power supplies VDD1 (1.5V) and VDD2 (3.3V). The circuit 100 may provide output voltage levels from 3.3V down to 0V and full scale of the output voltages. Therefore, the circuit 100 may provide output clocks that provide voltages down to zero volts. Additionally, the circuit 100 may implement the capacitor CBOOT as a bootstrapping device that may be charged on every low to high transition on the input. The circuit 100 may also have low power consumption and reduced static power dissipation.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A method for providing inverting level shifting, comprising the steps of:
   (A) generating a complementary signal, of an input signal, ranging between a first supply voltage and a second supply voltage in response to said input signal;
   (B) switching said input signal in response to one or more control signals;
   (C) presenting said complementary signal to a first terminal of a capacitor;
   (D) controlling a voltage level at a second terminal of said capacitor in response to said complementary signal, a third supply voltage and an output signal; and
   (E) generating said output signal ranging between said third supply voltage and said second supply voltage in response to said complementary signal and said voltage level at said second terminal of said capacitor.

2. The method according to claim 1, wherein said first supply voltage is at a first positive voltage, said second supply voltage is at a ground voltage and said third supply voltage is at a second positive voltage that is greater than said first positive voltage.

3. The method according to claim 1, further comprising:
   controlling a voltage level of said complementary signal in response to said one or more control signals.

4. The method according to claim 1, wherein step (E) further comprises:
   presenting said complementary signal to a first gate of a transistor pair and said voltage level at said second terminal of said capacitor to a second gate of said transistor pair.

5. The method according to claim 4, wherein step (E) further comprises:
   providing a level shift in response to a voltage potential of said capacitor.

6. The method according to claim 5, wherein step (E) further comprises:
   turning oft a device in response to said complementary signal.

7. The method according to claim 1, wherein step (D) further comprises:
   limiting a rise of said voltage level at said second terminal of said capacitor above said third supply voltage.

8. The method according to claim 1, wherein step (E) further comprises:
   providing low power consumption; and
   eliminating static power offset.

9. A method for providing inverting level shifting, comprising the steps of:
   (A) receiving a complementary signal, of an input signal, ranging between a first supply voltage and a second supply voltage at a first terminal of a capacitor;
   (B) controlling a voltage level at a second terminal of said capacitor in response to said complementary signal, a third supply voltage and an output signal;
   (C) generating said output signal ranging between said third supply voltage and said second supply voltage in response to said complementary signal and said voltage level at said second terminal of said capacitor;
   (D) providing low power consumption; and
   (E) eliminating static power offset.

10. The method according to claim 9, further comprising:
    generating said complementary signal in response to said input signal; and
    switching said input signal in response to one or more control signals.

11. A method for providing inverting level shifting, comprising the steps of:
    generating a complementary signal (i) ranging between a first supply voltage and a second supply voltage and as a complement of an input signal while an indication signal is received in a first state and (ii) at approximately said first supply voltage while said indication signal is in a second state;
    generating an output signal ranging between a third supply voltage and said second supply voltage in response to said complementary signal; and
    maintaining a voltage across a capacitor approximately equal to a difference between said third supply voltage and said first supply voltage while said indication signal is in said second state, wherein said third supply voltage is greater than said first supply voltage.

12. The method according to claim 11, further comprising the step of:
    recharging said capacitor in response to said complementary signal.

13. The method according to claim 11, further comprising the step of:
    recharging said capacitor in response to a transition of said complementary signal.

14. The method according to claim 11, further comprising the step of:
    receiving said complementary signal at a first terminal of said capacitor.

15. The method according to claim 14, further comprising the step of:
    charging a second terminal of said capacitor to said third supply voltage while (i) said complementary signal and (ii) said output signal both have respective voltage levels greater than said second supply voltage.

16. The method according to claim 15, further comprising the step of:
    generating an intermediate signal in response to said output signal, said first supply voltage and said second supply voltage.

17. The method according to claim 16, further comprising the step of:
    logically ANDing said complementary signal and said intermediate signal.

18. The method according to claim 11, further comprising the step of:
    generating a complementary output signal in response to said output signal.

19. The method according to claim 18, further comprising the steps step of:
    driving a logic stage in response to said complementary output signal.

* * * * *

UNITED STATES PATENT AND TRADEMARK OFFICE
CERTIFICATE OF CORRECTION

PATENT NO. : 6,771,110 B2
DATED : August 3, 2004
INVENTOR(S) : Sean A. Golliher et al.

It is certified that error appears in the above-identified patent and that said Letters Patent is hereby corrected as shown below:

Delete Figs. 1-4 and replace with the attached Figs. 1-4.

Signed and Sealed this

Fifth Day of April, 2005

JON W. DUDAS
*Director of the United States Patent and Trademark Office*

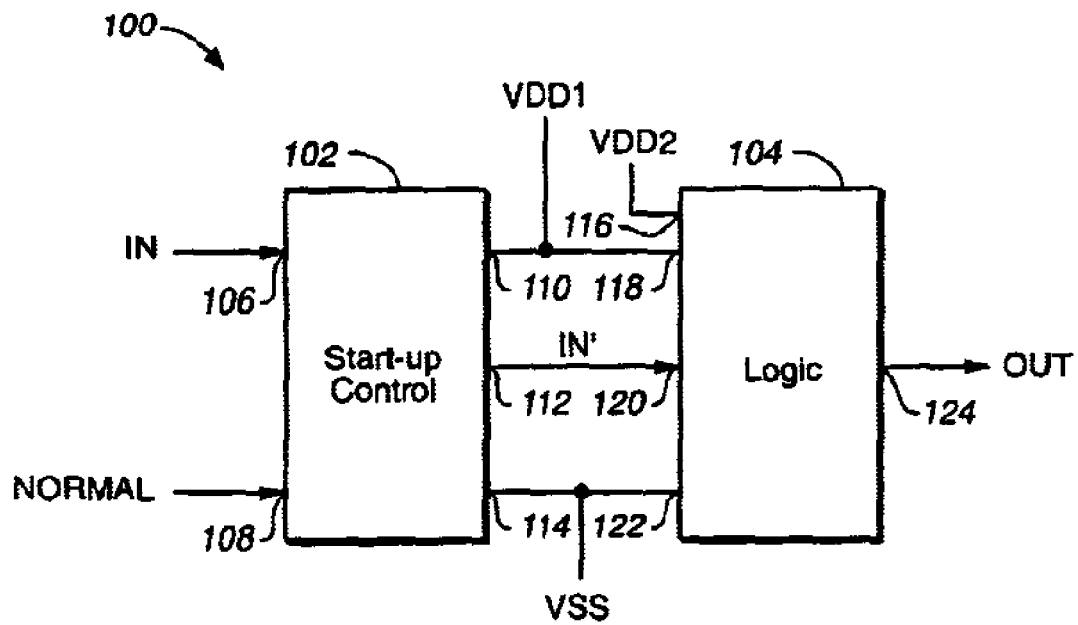
FIG._1

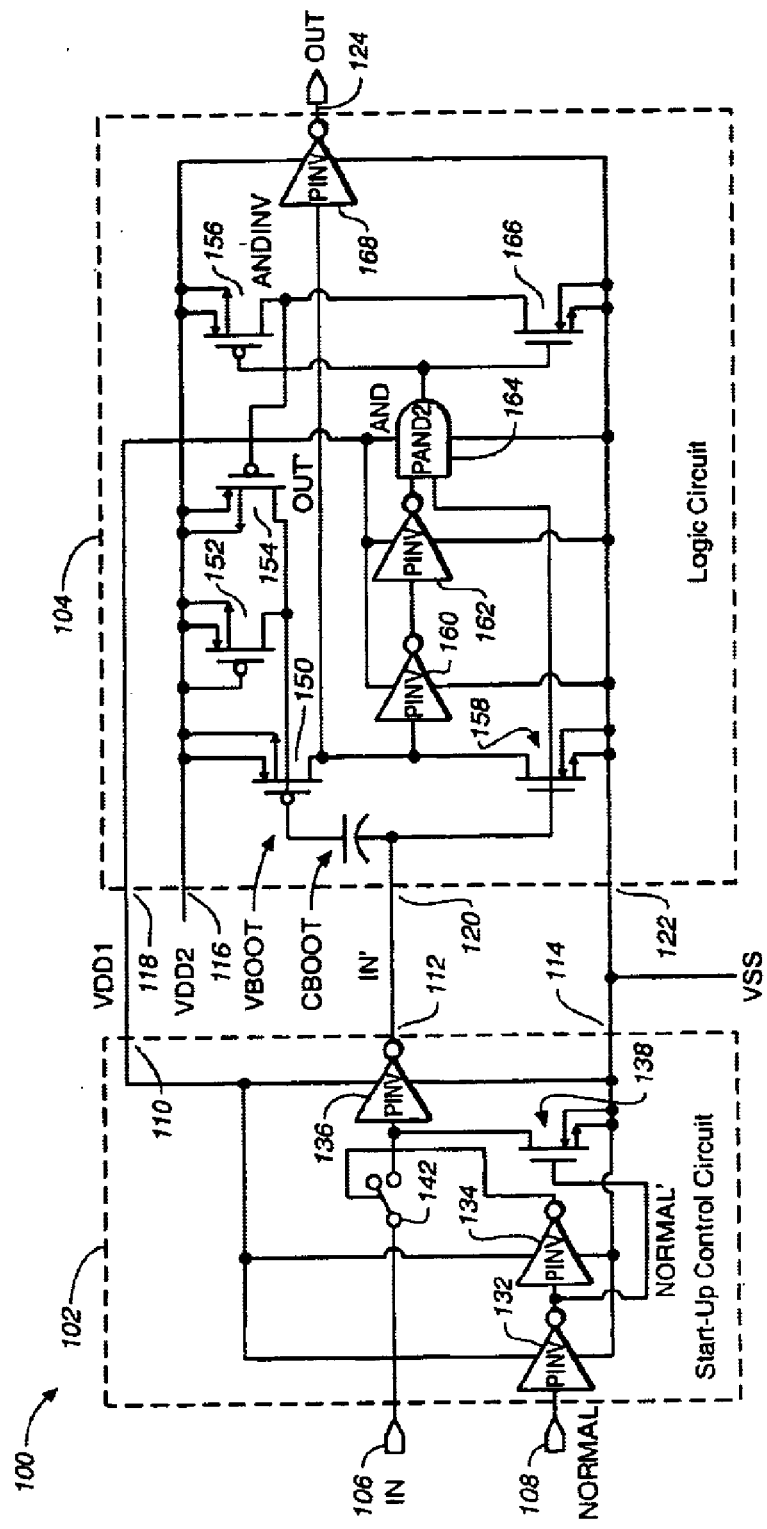
FIG._2

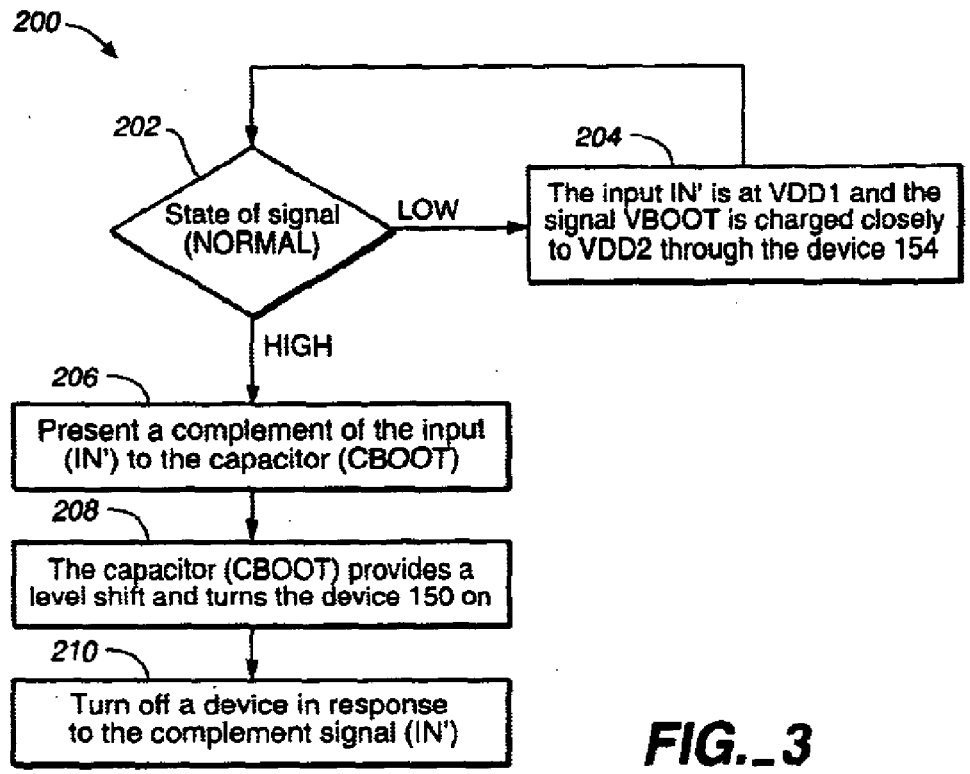
FIG._3
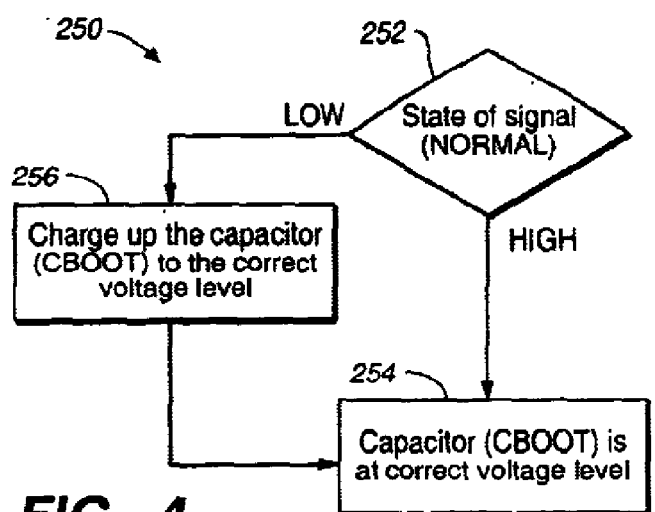
FIG._4